(12) United States Patent (10) Patent No.: US 7,738,290 B2
Nakai (45) Date of Patent: Jun. 15, 2010

(54) PHASE CHANGE MEMORY DEVICE

(75) Inventor: Kiyoshi Nakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 86 days.

(21) Appl. No.: 12/035,551

(22) Filed: Feb. 22, 2008

(65) Prior Publication Data

US 2008/0205128 A1    Aug. 28, 2008

(30) Foreign Application Priority Data

Feb. 28, 2007    (JP) .......................... P2007-049947

(51) Int. Cl.
*G11C 11/00* (2006.01)
(52) U.S. Cl. ...................... 365/163; 365/148
(58) Field of Classification Search ................. 365/163, 365/148, 100
See application file for complete search history.

(56) References Cited

U.S. PATENT DOCUMENTS

| | | | | |
|---|---|---|---|---|
| 7,254,059 | B2* | 8/2007 | Li et al. .................. | 365/185.03 |
| 7,324,365 | B2* | 1/2008 | Gruening-von Schwerin et al. ............................ | 365/148 |
| 7,375,365 | B2* | 5/2008 | Hsiung ........................... | 257/2 |
| 7,515,455 | B2* | 4/2009 | Nirshl et al. ................. | 365/148 |
| 2007/0164267 | A1* | 7/2007 | Asano et al. .................... | 257/5 |

FOREIGN PATENT DOCUMENTS

| | | |
|---|---|---|
| CN | 1717748 | 1/2006 |
| JP | 2005-522045 | 7/2005 |
| JP | 2005-317713 | 11/2005 |
| JP | 2006-155700 | 6/2006 |
| TW | 254443 | 5/2006 |

OTHER PUBLICATIONS

Masahiro Okuda, Editor, "Technology and Materials for Future Optical Memories", CMC Publishing Co., Ltd., pp. 89-90, Jan. 31, 2004.
Chinese Patent Office issued a Chinese Office Action dated Jun. 5, 2009, Application No. 200810096348.X.

* cited by examiner

*Primary Examiner*—Anh Phung
(74) *Attorney, Agent, or Firm*—Young & Thompson

(57) ABSTRACT

A phase change memory device has a memory cell that uses a phase change film as a storage element, and includes: a first phase change region formed on a side of one face of the phase change film; and a second phase change region formed on a side of another face of the phase change film in a position that corresponds to the first phase change region, wherein the phase change memory stores two-bit data using combinations of a high resistance state due to amorphization and a low resistance state due to crystallization in the first phase change region with the high resistance state and the low resistance state in the second phase change region, the resistance value of the low resistance state being lower than that of the high resistance state.

13 Claims, 9 Drawing Sheets

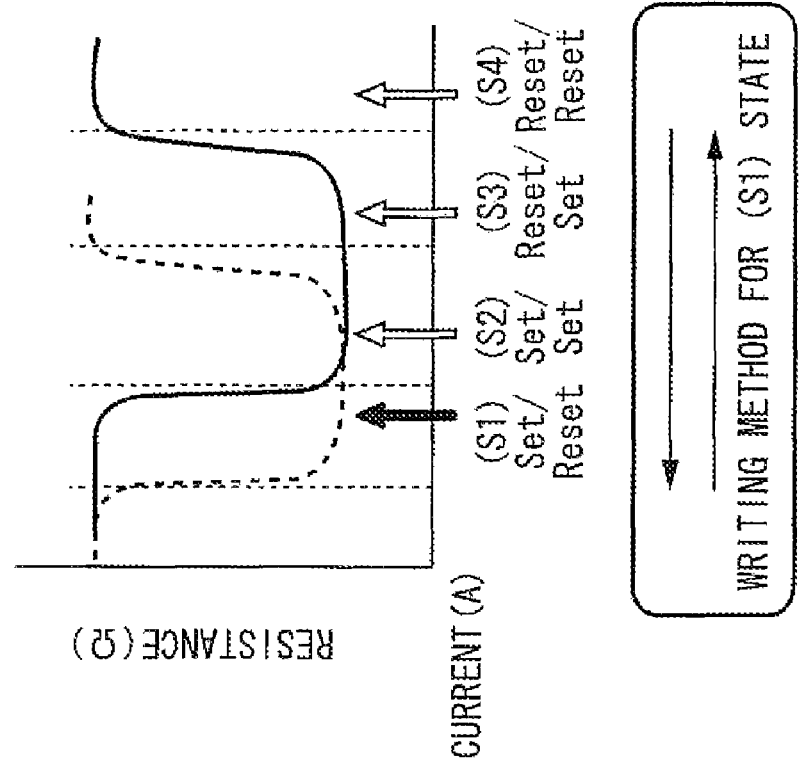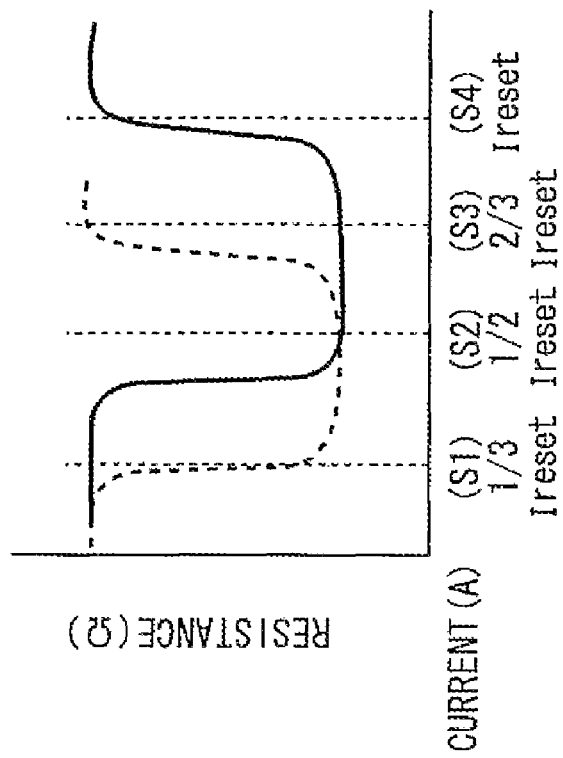
FIG. 3A
FIG. 3B

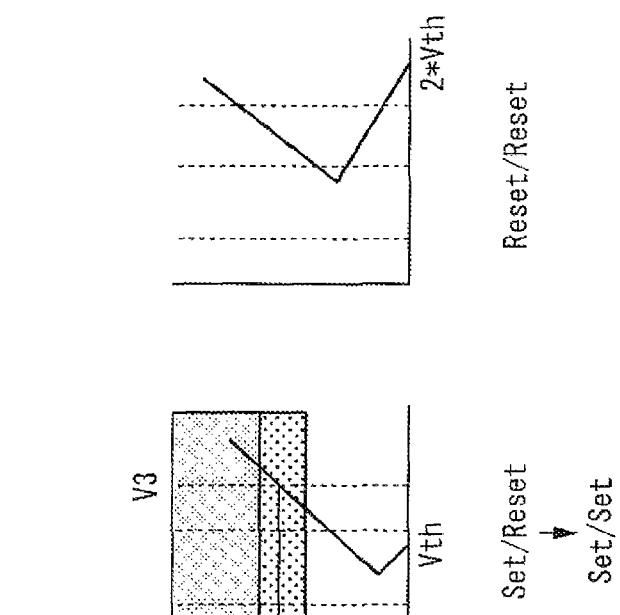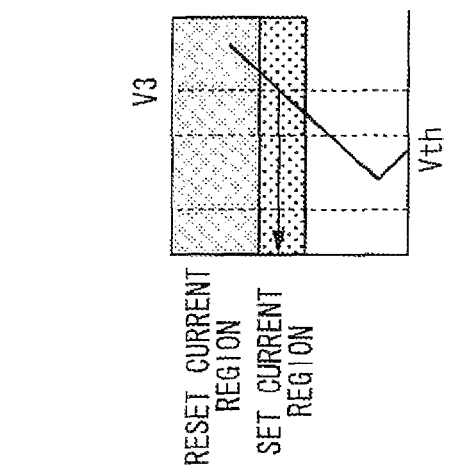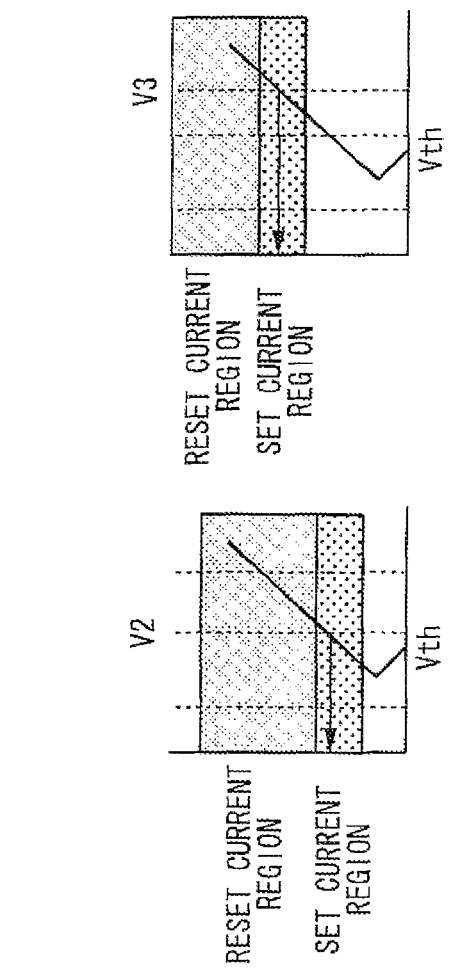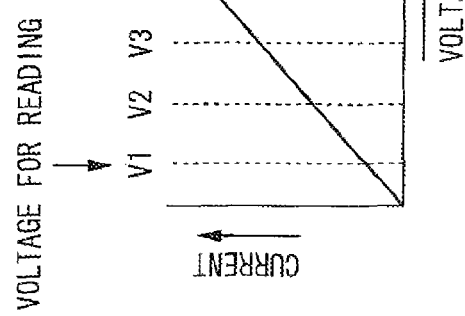

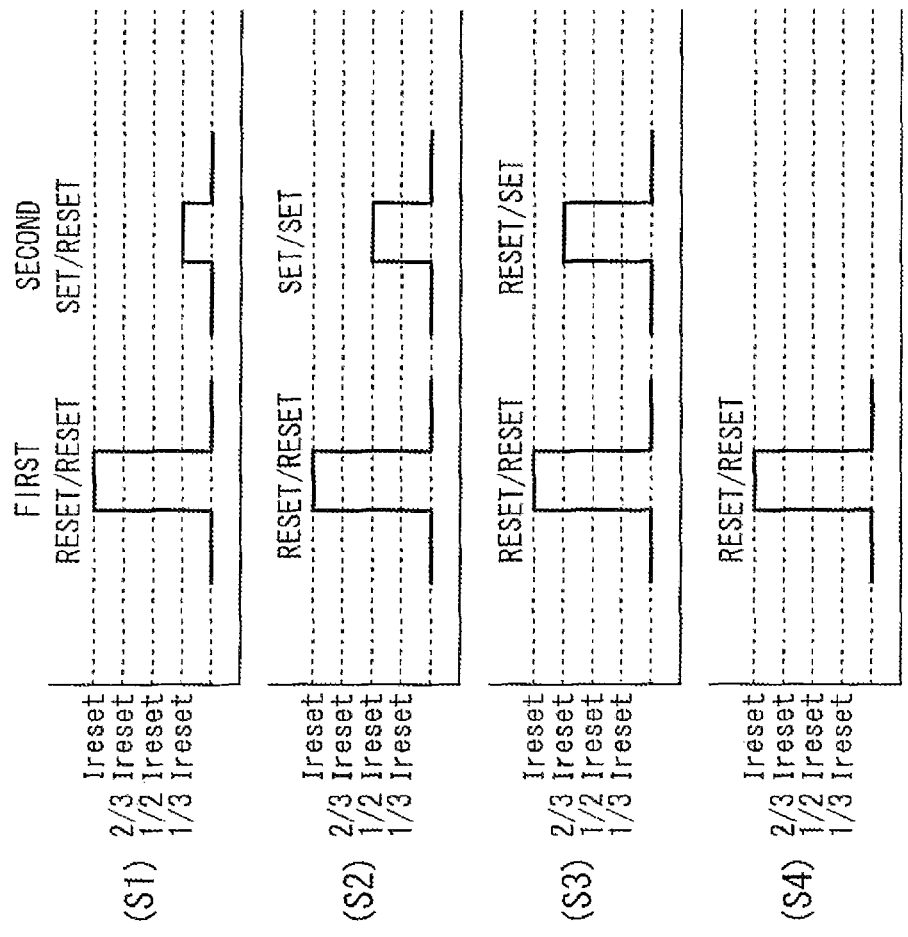
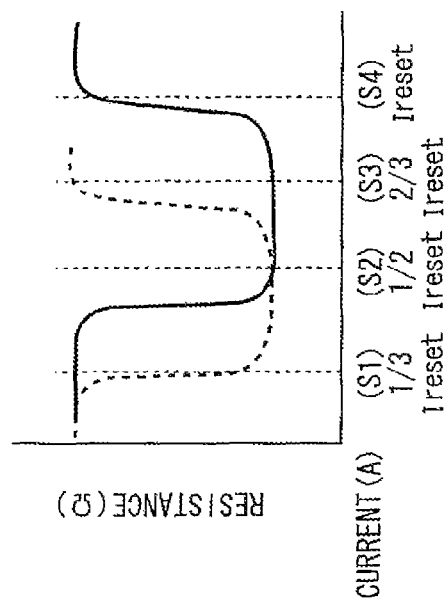

PHASE CHANGE MEMORY DEVICE

BACKGROUND OF THE INVENTION

1. Field of the Invention

The present invention relates to a phase change memory device capable of retaining two-bit data in one memory cell.

The present invention can be applied to fields including a phase change memory (PRAM), and MARAM and RRAM (Resistive RAM) that are capable of controlling (changing) resistance values.

Priority is claimed on Japanese Patent Application No. 2007-049947, filed on Feb. 28, 2007, the content of which is incorporated herein by reference.

2. Description of Related Art

As a method of realizing a multi-level memory cell (for example, two bits per one memory cell) that uses a phase change film as a storage element (i.e., phase change memory cell) there has been proposed a storage method in which the resistance value of a memory cell is controlled in four levels. In this case, in order to perform writing of an intermediate level resistance value, the resistance value is controlled by controlling the amount of electric current to be applied to an element when writing, thereby creating a resistance value in an intermediate state. Data reading is performed by comparing the resistance value with three types of reference potentials (or reference currents). Such a method has been proposed as a method for storing multi-level data.

FIG. 8A shows a distribution of resistance of a variable-resistance type multi-level memory cell. Since one memory cell retains two-bit data, writing is controlled so that the memory cell has a resistance distribution corresponding to four-levels. FIG. 8B shows a relationship between writing electric current and resistance value of the phase change memory. The resistance value after writing changes in accordance with the electric current values on the horizontal axis. The resistance value increases from the point where the electric current is approximately 500 microamperes, and the phase change memory starts to become amorphous after writing.

In order to control the resistance value, the writing electric current is controlled to change the resistance value. In the case of this example, a resistance distribution shown in FIG. 8A can be created by applying electric currents (1) to (4).

As a multi-level writing method, there have been proposed: a method of controlling the voltage or electric current when writing is performed; and a method of controlling the resistance value by changing the number of application of writing pulses. However, both of the writing methods are still a method for storing data by changing the resistance value of a single phase change region.

Furthermore, FIG. 9A and FIG. 9B respectively show a cross-sectional structure and a schematic circuit diagram of a conventional one bit per memory cell. FIG. 9A is an example of the structure of the phase change memory cell.

In FIG. 9A, a gate electrode 2 is arranged on a silicon (Si) substrate 1, a memory cell transistor is formed, and a VSS contact 3 and a D contact 5 are connected to the memory cell transistor. The VSS contact 3 is connected to a ground line 4. Moreover, a Mid contact 6 is formed on the D contact 5, a lower electrode 7b is arranged on the Mid contact 6, and a heater 9 for creating phase changes is formed on the lower electrode 7b. In order to reduce the writing electric current of the heater 9, after forming an opening, a dielectric film (side wall) 8 is formed in the opening so as to reduce the size of the lower electrode 7b to smaller than the diameter of the opening. A phase change film (GST) 10 is formed on the heater 9, and an upper electrode (bit line BL) 11, which is a metal wiring, is formed thereon.

FIG. 9B shows an equivalent circuit of a conventional memory cell. A single resistance element (phase change element) R is connected to a single transistor (MOS (Metal Oxide Semiconductor) transistor). A phase change region is created in the contact portion between the lower electrode 7b and the phase change film 10. That is, in the case where an electric current is applied to this circuit, the electric current density in this portion becomes the highest, and the temperature of this portion is likely to become the highest due to its heat generation. As described above, the conventional multi-level memory cell employs a method in which the degree of crystallization of a single phase change region is controlled to change resistance values in an analog manner, and four-level data or eight-level data is stored (refer to FIG. 8A and FIG. 8B).

The advantage of the above conventional method is that reading is performed non-destructively and the number of bits to be stored can be increased, for example, to two or four, as long as the resistance value can be controlled accurately. On the other hand, the disadvantage of this method is that the accuracy of the resistance value after writing needs to be improved because the range of the resistance value becomes narrower. To this end, there has been proposed a method of controlling the resistance accurately while performing a verifying operation (refer to Japanese Unexamined Patent Application, First Publication No. 2006-155700 (hereinafter referred to as Patent Document 1)).

However, in this method, writing requires a long period of time because the verifying operation needs to be performed, and the accuracy of the resistance and the value of the reference potential (reference current) used for reading need to be controlled at a high level of precision because the resistance has a temperature dependency.

Moreover, pp. 89-90 of "Technology and Materials for Future Optical Memories", edited by Masahiro Okuda, CMC Publishing Co., Ltd., Jan. 31, 2004 (hereinafter referred to as Non-Patent Document 1) discloses the result of 16-level recording of a phase change ovonic memory, and it describes the result of 16-level writing between 5 kilo-ohms to 500 kilo-ohms by controlling the writing electric current.

Furthermore, an example of a phase change memory device of a conventional technique is disclosed in Published Japanese Translation No. 2005-522045 of PCT International Publication (hereinafter referred to as Patent Document 2). In this conventional phase change memory device, variable resistance elements formed from four phase change layers are commonly connected to a word line WL via a selection transistor, while the bit line BL is connected to each of the resistance elements, and sixteen-level data are expressed in accordance with the electric current applied to each of the bit lines.

However, this conventional phase change memory device has a problem in that a high level of accuracy is required in electric current detection after writing, and its circuit configuration and writing sequence becomes complex.

Moreover, an example of a semiconductor device of a conventional technique is disclosed in Japanese Unexamined Patent Application, First Publication No. 2005-317713 (hereinafter referred to as Patent Document 3). However, the object of this conventional semiconductor device is to change the crystalline state of a phase change film by heat application after forming a circuit, to thereby change the connection state of the circuit connected to the phase change film, and its object and configuration are therefore different from those of the present invention.

As described above, in the conventional method, a higher level of accuracy is required for the resistance value after writing because the range of the resistance value becomes narrower. As a result, there has been proposed a method of controlling the resistance at a high level of accuracy while performing a verifying operation.

However, there is a problem in this method in that writing requires a long period of time because a verifying operation needs to be performed, and the accuracy in the resistance and the value of reference potentials (reference currents) used when reading need to be controlled at a high level of precision because the resistance has a temperature dependency.

The present invention takes the above circumstances into consideration. and an object of the present invention is to provide a phase change memory device that: requires only one type of a reading reference potential; does not require a verifying operation; enables simplification of its circuit configuration and writing sequence; and is capable of performing writing two bits into a conventional one bit memory cell region.

A phase change memory device of the present invention has a memory cell that uses a phase change film as a storage element, and includes: a first phase change region formed on a side of one face of the phase change film; and a second phase change region formed on a side of another face of the phase change film in a position that corresponds to the first phase change region, and the phase change memory stores two-bit data using combinations of a high resistance state due to amorphization and a low resistance state due to crystallization in the first phase change region with the high resistance state and the low resistance state in the second phase change region, the resistance value of the low resistance state being lower than that of the high resistance state.

In the phase change memory device of the present invention configured as described above, two phase change elements (resistance elements) formed by the two phase change regions are connected in series, and these two phase change elements are capable of being brought into one of two states respectively, namely a high resistance state and a low resistance state, and two-bit data (four-level data) is recorded using combinations of these states.

As a result, it becomes possible to record two-bit data using combinations of the two phase change elements (resistance elements). Moreover, since data reading is performed while judging whether the resistance value of the entire phase change elements (resistance elements) connected in series is a high resistance or a low resistance, the reference potential for reading needs to be only one type, a verifying operation is not required, and the circuit configuration and writing sequence can be simplified. Furthermore, it is possible to perform writing of two-bit data into a conventional one bit memory cell region.

Preferably, in the phase change memory device, the first phase change region is formed in a close vicinity of a contact face between the phase change film and a first electrode that is arranged so as to contact the one face of the phase change film or a recess section on the one face, the second phase change region is formed in a close vicinity of a contact face between the phase change film and a second electrode that is arranged so as to contact the other face of the phase change film or a recess section on the other face, an area of the contact face between the first electrode and the phase change film differs from an area of the contact face between the second electrode and the phase change film, and a common electric current is applied to the first electrode and the second electrode through a transistor that forms the memory cell.

In the phase change memory device of the present invention configured as described above, an electric current is applied to the first phase change region through the first electrode, and the electric current is applied to the second phase change region through the second electrode. In this case, the contact area between the first electrode and the phase change film is made different from that between the second electrode and the phase change film. The electric currents applied to the first electrode and the second electrode are the same electric current. It is a commonly known characteristic that the electric current required for making a phase change film into amorphous (making it a high resistance) or crystallizing the phase change film (making it a low resistance) is proportional to the contact area. Therefore, this characteristic is used to create a difference between the characteristics of the first phase change region and the second phase change region.

Accordingly, the difference between the characteristics of the first phase change region and the second phase change region (difference in the characteristic due to the applied electric current) is utilized, and recording of two-bit data (four-level data) can be realized by making use of combinations thereof.

Preferably, in the phase change memory device, a first heater is formed in a portion where the first electrode and the phase change film are in contact with each other, and a second heater is formed in a portion where the second electrode and the phase change film are in contact with each other.

In the phase change memory device of the present invention configured as described above, the first heater is formed in a portion where the first electrode and the phase change film are in contact with each other, and the second heater is formed in a portion where the second electrode and the phase change film are in contact with each other.

As a result, transition of the phase change film into a crystallized state or into an amorphous state can be carried out efficiently.

Preferably, in the phase change memory device, the first electrode is arranged on a side of a metal wiring on which a bit line of the memory cell is formed, and the second electrode is arranged on a side of the transistor of the memory cell.

In the phase change memory device of the present invention configured as described above, the first electrode is provided on the metal wiring side on which the bit line is formed, and the second electrode is provided on the transistor side.

Therefore, the phase change film having the first phase change region and the second phase change region can be arranged between the second electrode connected to the transistor formed on a silicon substrate or the like and the first electrode connected to the metal wiring that forms the bit line. Thereby, writing of two bits into a conventional one bit memory cell region can be realized, and a memory cell region required for storing one bit can be made smaller.

Preferably, in the phase change memory device, the first phase change region is brought from the high resistance state into the low resistance state by an electric current of a first electric current level Ireset1 applied through the first electrode, and the first phase change region is brought from the low resistance state into the high resistance state by an electric current of a third electric current level Ireset3 applied through the first electrode, and the second phase change region is brought from the high resistance state into the low resistance state by an electric current of a second electric current level Ireset2 applied through the second electrode, and the second phase change region is brought from the low resistance state into the high resistance state by an electric current of a fourth electric current level Ireset4 applied through the second electrode, where Ireset1<Ireset2<Ireset3<Ireset4.

In the phase change memory device of the present invention configured as described above, the range of the electric current for bringing the first phase change region into a low resistance state (Ireset1 to Ireset3) is made to be different from the range of the electric current for bringing the second phase change region into a low resistance state (Ireset2 to Ireset4), and only some portions of these ranges overlap with each other.

As a result, by controlling the electric current to be applied to the first phase change region and the second phase change region, setting (data writing) for bringing each of the first phase change region and the second phase change region into either a high resistance state or a low resistance state can be performed.

Preferably, the phase change memory device further includes: a first resistance value writing device that sets the first phase change region to the high resistance state and to set the second phase change region to the high resistance state by applying an electric current of the fourth electric current level Ireset4 to the first electrode and the second electrode; a second resistance value writing device that sets the first phase change region to the low resistance state and to set the second phase change region to the high resistance state by applying an electric current of the first electric current level Ireset1 to the first electrode and the second electrode after an electric current of the fourth electric current level Ireset4 has been applied to the first electrode and the second electrode; a third resistance value writing device that sets the first phase change region to the low resistance state and to set the second phase change region to the low resistance state by applying an electric current of the second electric current level Ireset2 to the first electrode and the second electrode after an electric current of the fourth electric current level Ireset4 has been applied to the first electrode and the second electrode; and a fourth resistance value writing device that sets the first phase change region to the high resistance state and to set the second phase change region to the low resistance state by applying an electric current of the third electric current level Ireset3 to the first electrode and the second electrode after an electric current of the fourth electric current level Ireset4 has been applied to the first electrode and the second electrode.

In the phase change memory device of the present invention configured as described above, when performing setting (data writing) for bringing each of the first phase change region and the second phase change region into either a high resistance state or a low resistance state, an electric current is applied (for example, a pulse voltage is applied) once or twice.

In the case where the first phase change region and the second phase change region are set to a high resistance state, an electric current of Ireset4 is applied once.

In the case where the first phase change region is set to a low resistance state and the second phase change region is set to a high resistance state, an electric current of Ireset1 is applied after the electric current of Ireset4 has been applied.

In the case where the first phase change region is set to a low resistance state and the second phase change region is set to a low resistance state, an electric current of Ireset2 is applied after the electric current of Ireset4 has been applied.

In the case where the first phase change region is set to a high resistance state and the second phase change region is set to a low resistance state, an electric current of Ireset3 is applied after the electric current of Ireset4 has been applied.

As a result, by performing writing once or twice, writing of two bits into a conventional one bit memory cell region can performed.

Preferably, the phase change memory device further includes: a first resistance value reading device that determines whether an entire resistance value of the first phase change region and the second phase change region is in a high resistance state that is higher than a predetermined resistance value or in a low resistance state that is lower than the predetermined resistance value, by applying a voltage within a range in which the crystalline state of the first phase change region and the second phase change region is not changed; a first electric current application device that applies an electric current of the first electric current level Ireset1 to the first phase change region and the second phase change region while limiting a voltage to be applied to the first electrode and the second electrode so as not to exceed a voltage twice a threshold voltage of each phase change region, in the case where the first resistance value reading device determines that the entire resistance value is the high resistance state; a second resistance value reading device that determines whether the entire resistance value is in the high resistance state or in the low resistance state, after the first electric current application device has applied the electric current; a second electric current application device that applies an electric current of the second electric current level Ireset2 to the first phase change region and the second phase change region while limiting a voltage to be applied to the first electrode and the second electrode so as not to exceed the voltage twice the threshold voltage of each phase change region, in the case where the second resistance value reading device determines that the entire resistance value is the high resistance state; and a third resistance value reading device that determines whether the entire resistance value is in the high resistance state or in the low resistance state, after the second electric current application device has applied the electric current.

In the phase change memory device of the present invention configured as described above, the following steps are performed in reading of whether each of the first phase change region and the second phase change region is in a high resistance state or a low resistance state.

First, with a first resistance value reading device, the resistance value of the entire region including the first phase change region and the second phase change region is read. At this time, if the entire resistance value is a low resistance, the first phase change region is judged to be in a low resistance state and the second phase change region is judged to be in a low resistance state.

If the first resistance value reading device judges the resistance as a high resistance, a first electric current application device applies the Ireset1 electric current to the first phase change region and the second phase change region, and then a second resistance value reading device reads the entire resistance value. At this time, if the entire resistance value is a low resistance, the first phase change region is judged to be in a high resistance state and the second phase change region is judged to be in a low resistance state. When applying an Ireset1 electric current, the voltage to be applied in between the first electrode and the second electrode is limited so as not to exceed a voltage twice the threshold (the voltage at which the electric current starts to flow) of each of the phase change regions, and if the first and second phase change regions are in a high resistance state, then this state is maintained.

If the second resistance value reading device judges the resistance as a high resistance, a second electric current application device applies the Ireset2 electric current, and then a third resistance value reading device reads the entire resistance value. At this time, if the entire resistance value is a low resistance, the first phase change region is judged to be in a low resistance state and the second phase change region is judged to be in a high resistance state. When applying an Ireset2 electric current, the voltage to be applied in between the first electrode and the second electrode is limited so as not to exceed a voltage twice the threshold (the voltage at which the electric current starts to flow) of each of the phase change regions, and if the first and second phase change regions are in a high resistance state, then this state is maintained.

If the third resistance value reading device judges the resistance as a high resistance, the first phase change region is judged to be in a high resistance state and the second phase change region is judged to be in a high resistance state.

As a result, it can be read whether each of the first phase change region and the second phase change region is in a high resistance state or in a low resistance state.

Preferably, in the phase change memory device, the first electric current application device and the second electric current application device are provided with a device for performing rewriting for bringing the first phase change region and the second phase change region into their original states, if an electric current has been applied to the first phase change region and the second phase change region.

In the phase change memory device of the present invention configured as described above, since reading of whether each of the first phase change region and the second phase change region is in a high resistance state or in a low resistance state is performed destructively, rewriting for bringing the first phase change region and the second phase change region into their original states is performed in accordance with the read data (high resistance state or low resistance state).

As a result, having read whether each of the first phase change region and the second phase change region is in a high resistance state or in a low resistance state, each of the first phase change region and the second phase change region can be restored to their original states (high resistance state or low resistance state).

Preferably, the phase change memory device, the area of the contact face between the first electrode and the phase change film is set so as to be substantially two thirds of the area of the contact face between the second electrode and the phase change film, and the first electric current level Ireset1, the second electric current level Ireset2, and the third electric current level Ireset3 are respectively set approximately as follows: Ireset1=(⅓)×Ireset4, Ireset2=(½)×Ireset4, and Ireset3=(⅔)×Ireset4.

As a result, the electric current to be applied to the first phase change region and the second phase change region, can be set in a good balance.

A first effect of the phase change memory device of the present invention is that in a phase change memory cell, in order to realize multi-level states of the phase change films (GST) in the close vicinity of the upper electrode and the lower electrode using four combinations of the set state and the reset state, the reading reference potential need be only one type, and since a resistance difference in the case of a high resistance and a low resistance can be large, the reading reference potential can be similar to that in the case of a generic one bit per memory cell.

A second effect is that since there are only two types of states of the resistance of the memory cell, that is, "high resistance in a reset state" and "low resistance in a set state", the level of accuracy in resistance value control in writing may be low. Therefore, a verifying operation is not required and the circuit configuration and writing sequence can be simplified.

Moreover, a third effect of the present invention is that a multi-level state can be realized by forming the phase change regions in two locations, that is, the upper electrode and the lower electrode. As a result, writing of two bits into a conventional one bit memory cell region can be performed, and a memory cell region required for storing one bit data can be made smaller.

BRIEF DESCRIPTION OF THE DRAWINGS

FIG. 3A and FIG. 3B are diagrams for explaining a writing method of two bits per cell, FIG. 3A being a diagram showing electric current regions of four states, and FIG. 3B being a diagram showing a writing method of four states.

FIG. 4A to FIG. 4D are diagrams for explaining I-V characteristics and a method of reading four states of two bits per cell.

FIG. 5A to FIG. 5C are diagrams showing a method of applying writing pulse(s) for creating four states.

DETAILED DESCRIPTION OF THE INVENTION

Outline

As a method of a multi-level storage of two-bit data into one memory cell of a phase change memory cell (i.e., a method of achieving a multi-level phase change memory cell (two bits per one memory cell)), there has been proposed a storage method of controlling the resistance value of a memory cell in four levels. Moreover, as the multi-level writing method, as described above, there have been proposed: a method of controlling the writing voltage or the writing electric current; and a method of controlling the resistance value by changing the number of application of writing pulses. However, both of the writing methods are still a method for storing data by changing the resistance value of a single phase change region.

The advantage of these methods is that reading is performed non-destructively and the number of bits to be stored can be increased, for example, to two or four, as long as the resistance value can be controlled accurately. On the other hand, the disadvantage of these methods is that a high level of accuracy in the resistance value after writing is required because the allowable range of the resistance value becomes narrower, and a high level of accuracy is required for reference potentials (reference currents) because the resistance value has a temperature dependency.

In the present invention, in order to avoid such a disadvantage, two phase change elements (resistance elements) formed by two phase change regions are connected in series, these two phase change elements respectively have two states, that is, a high resistance state and a low resistance state, and two-bit data is stored using combinations of these states, thereby enhancing the integration of the memory cell.

Description of the Configuration of the Phase Change Memory Device in Accordance with the Embodiment of the Present Invention Next, the phase change memory device in accordance with the embodiment of the present invention is described in detail, with reference to the drawings.

Figure 1A:
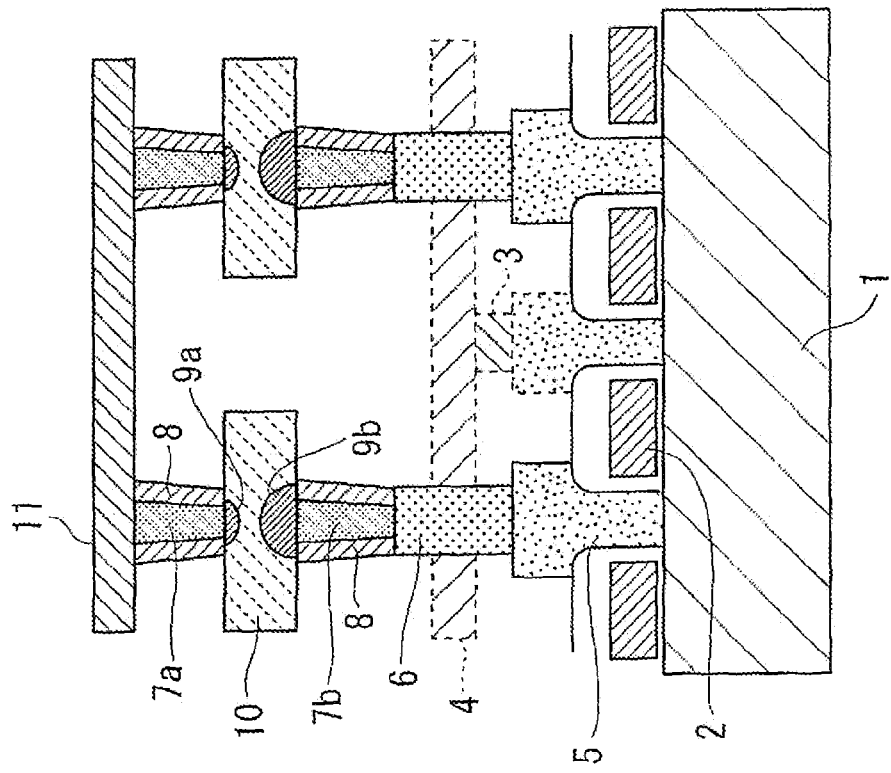
FIG. 1A shows a cross-sectional structure of a phase change memory cell (two bits per cell) in a phase change memory device in accordance with an embodiment of the present invention.
Figure 1B:
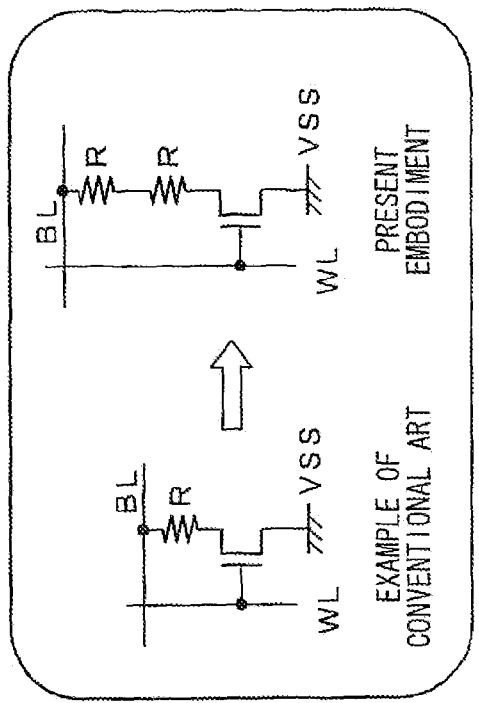
FIG. 1B is a schematic circuit diagram of the phase change memory cell shown in FIG. 1A.

FIG. 1A and FIG. 1B show a cross-sectional structure and a schematic circuit diagram of a phase change memory cell provided in the phase change memory device in accordance with the present embodiment. FIG. 1A shows a cross-sectional structure of the phase change memory cell, and FIG. 1B shows a schematic circuit diagram of a conventional circuit and a schematic circuit diagram of a two bits per memory cell of the present embodiment. The same reference symbols are given to elements the same as those of the conventional phase change memory cell shown in FIG. 9A and FIG. 9B.

Figure 9B:
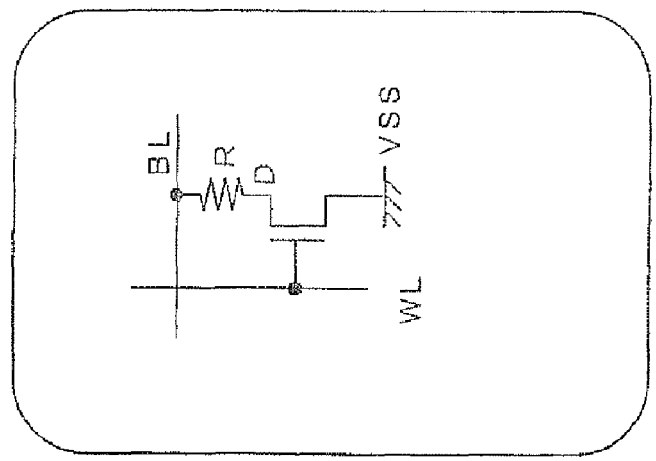
FIG. 9B is a schematic circuit diagram of the conventional one bit per cell.
Figure 9A:
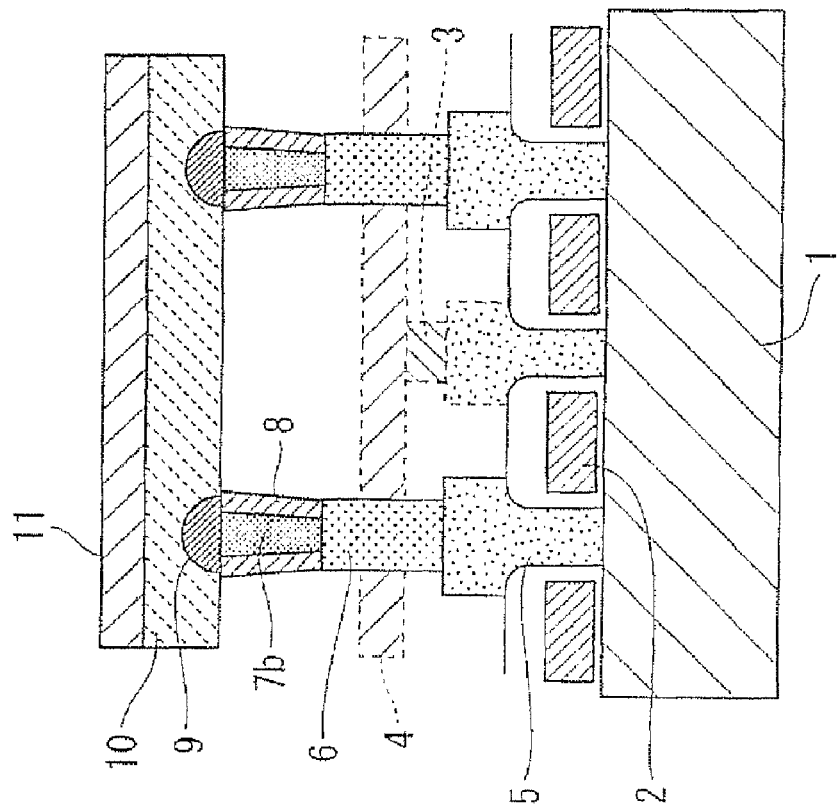
FIG. 9A is a diagram showing a cross-sectional structure of a conventional one bit per cell.

The configuration of the phase change memory cell in accordance with the present embodiment shown in FIG. 1A and FIG. 1B differs from that of the conventional phase change memory cell shown in FIG. 9A and FIG. 9B in that, as shown in FIG. 1B, in the two bits per memory cell in accordance with the present embodiment, in addition to the resistance element R used in the conventional example, another resistance element R is connected thereto in series.

In the cross-sectional structure shown in FIG. 1A, phase change regions are created respectively in a contact portion between an upper heater 9a arranged beneath an upper electrode 7a and a phase change film 10, and in a contact portion between a lower heater 9b arranged above a lower electrode 7b and the phase change film 10.

Moreover, the upper electrode 7a is not formed from a conventional upper electrode (metal wiring) 11 shown in FIG. 9A, but it is formed from a plug-shaped electrode as with the lower electrode 7b. An upper electrode (metal wiring) 11 of a bit line (BL) is connected to the upper portion of the upper electrode 7a. Furthermore, when fabricating (designing) this memory cell, the area of the contact portion between the lower electrode 7b and the phase change film 10 (the contact portion between the lower heater 9b above the lower electrode 7b and the phase change film 10) is made greater than the area of the contact portion between the upper electrode 7a and the phase change film 10 (the contact portion between the upper heater 9a beneath the upper electrode 7a and the phase change film 10). In the following example to be described, the former area is approximately 1.5 times the latter area (needless to say, this is not to be considered as limiting to 1.5 times).

In accordance with the above configuration, the contact area between the upper electrode 7a and the phase change film 10 is two thirds of the contact area between the lower electrode 7b and the phase change film 10. It is a well known characteristic that the electric current required when making the phase change film 10 amorphous or crystallized is proportional to the contact area.

When using Ireset to express the electric current (reset current) for making the memory cell immediately above the lower electrode 7b side into amorphous (high resistance), the reset current of the memory cell on the upper electrode 7a side is expressed as ($2/3$)×Ireset. On the other hand, if the electric current required for crystallizing a phase change portion (making it low resistance) on the lower electrode 7b side is adjusted to ($1/2$)×Ireset, the electric current required for crystallizing the phase change portion on the upper electrode 7a side is approximately ($1/3$)×Ireset.

The contact area between the memory cell and the phase change film (phase change material) is controlled so as to form elements having these two characteristics. The I-R (electric current—resistance) characteristics of these two elements are shown in FIG. 2A and FIG. 2B.

Figure 2B:
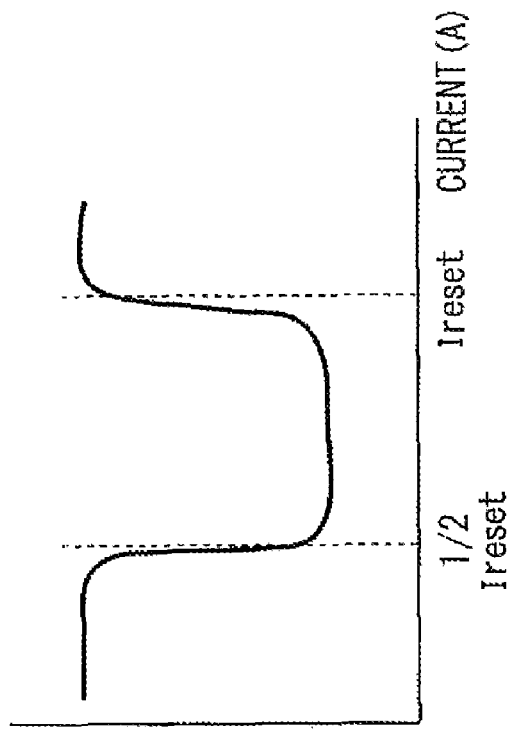
FIG. 2A and FIG. 2B are diagrams showing a difference in I-R characteristics due to a difference in contact areas, FIG. 2A being the characteristics of a phase change element immediately below an upper electrode, and FIG. 2B being the characteristics of a phase change element immediately above a lower electrode.
Figure 2A:
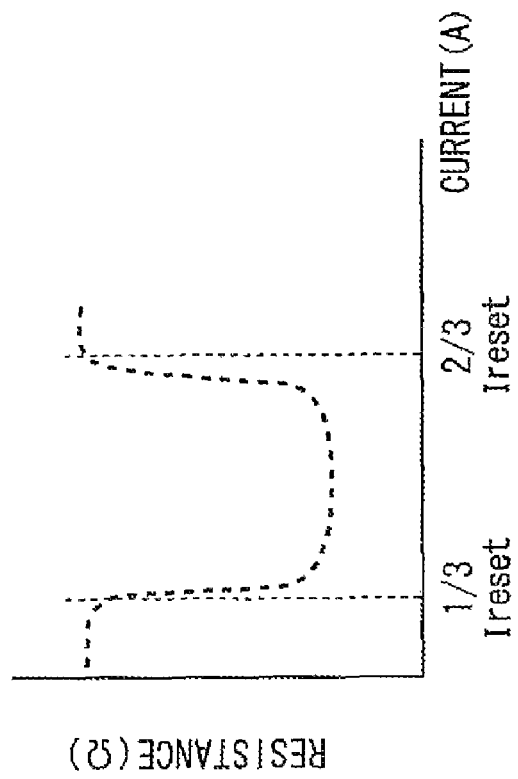

The I-R characteristics shown in FIG. 2A and FIG. 2B are graphs that show relationships between the electric current applied to the element when writing and the resistance value after writing in the case where a low voltage (low voltage that will not cause phase change to occur) is applied and the resistance value of the element is measured after the electric current is applied to the element. FIG. 2A shows the characteristic of a phase change element of the phase change film 10 immediately below the upper electrode 7a, and FIG. 2B shows the characteristic of a phase change element of the phase change film 10 immediately above the lower electrode 7b.

FIG. 3A and FIG. 3B show overlapping graphs of the I-R (electric current—resistance) characteristics of the two elements shown in FIG. 2A and FIG. 2B. As can be understood from these graphs, with respect to the applied electric current on the horizontal axis, there are four states corresponding to combinations of the resistance values of the two elements. The multi-level memory cell of the present embodiment is characterized in that it stores two-bit data using combinations of the resistance values of these two elements.

The first electrode, the first heater, the second electrode, and the second heater of the present invention mentioned above correspond respectively to the upper electrode 7a, the upper heater 9a, the lower electrode 7b, and the lower heater 9b. Ireset1, Ireset2, Ireset3, and Ireset4 of the present invention mentioned above correspond respectively to ($1/3$)×Ireset, ($1/2$)×Ireset, ($2/3$)×Ireset, and Ireset.

Description of the Method of Writing into the Phase Change Memory Cell

First, an example of the writing method in which four combinations of these resistance values are created is described.

Hereinafter, combinations of resistance values are described in the order of "phase state of the upper electrode 7a side"/"phase state of the lower electrode 7b side".

For example, in the case where the phase change film 10 of the upper electrode 7a portion (phase change region) is in a set state (resistance value is low) and the phase change film 10 of the lower electrode 7b portion (phase change region) is in a reset state (resistance value is high), it is described as a set/reset state.

Among the four combinations of the resistance values, three states (S2) to (S4) shown in FIG. 3A and FIG. 3B can be realized by performing writing once. These states can be created by applying an electric current corresponding to each state shown in FIG. 3A through the element.

On the other hand, the set/reset state (S1) cannot be created by performing writing once. Consequently, as shown in FIG. 3B, an electric current that creates a reset/reset state (S4) state is applied to the element once. Subsequently, an electric current in the region shown in (S1) is applied. As a result, only the upper electrode 7a side is brought into the set state. The reset state of the lower electrode 7b side is maintained because only an electric current less than that is required for the set (crystallization) state is applied to the lower electrode 7b side. With this writing method, the set/reset state can be created. That is to say, a writing operation needs to be performed twice in order to create the (S1) state.

Description of the Reading Method of the Phase Change Memory Cell

Next, a reading method is described. In order to read the four states in the phase change film, the following reading sequence is performed.

FIG. 4A to FIG. 4D are diagrams showing setting examples of a reading voltage and a reading current for reading the four states. Reading needs to be performed three times in order to differentiate the four states. When reading the resistance state of the memory cell, a voltage V1 shown in FIG. 4A (low voltage that will not cause a phase change to occur) is always applied.

When the first reading is performed, only the set/set state among the four states is identified as a low resistance state. In all other cases, any one of the phase change films 10 on either the upper electrode 7a side or the lower electrode 7b side is in the reset state (high resistance state), so that the resistance value is recognized as a high resistance. Therefore, in this first reading, it cannot be distinguished whether either one of the upper electrode side and the lower electrode side is a high resistance or whether both of them are a high resistance.

Consequently, as the next sequence, as shown in FIG. 4B, a pulse (pulse of voltage V2) of a condition that enables writing of a set state only for the upper electrode 7a side is applied to the element. At this time, for the transition to the set state, the voltage of the pulse is set to a voltage no less than Vth (threshold voltage at which electric current starts to flow into each of the phase change regions); however, the electric current is limited by a writing driver or the like so that only an electric current no more than ($\frac{1}{2}$)×Ireset can be applied.

Having applied this pulse, if the upper electrode 7a side is in the reset state, this state is changed to the set state. Then, a reading operation is performed again and it is judged whether the element is a high resistance or a low resistance. As a result of performing this reading, if it is judged as a low resistance (the set/set state), then it is judged that the states of the two elements were the reset/set state.

Subsequently, if it is not a low resistance (the set/set state) (i.e., if it is in a high resistance state), as shown in FIG. 4C, a pulse (pulse of voltage V3) of a condition that enables the lower electrode 7b side to be brought into the set state is applied. Then, a reading operation is performed again and it is judged whether the element is a high resistance or a low resistance. As a result of performing this reading, if it is judged as a low resistance (the set/set state), then it is judged that the states of the two elements were in the set/reset state.

Since each of the elements has a Vth threshold voltage if both of these two elements are in the reset state, then an electric current that would allow the state to be brought to a set state is not applied to the element unless a voltage greater than or equal to 2×Vth is applied to the element as shown in FIG. 4D. Accordingly, even the voltage (Vth) for writing of a set stat is applied twice, an electric current does not start to flow, and thus the state is maintained. If the resistance still stays high even after the second writing has been performed, it is judged that these two elements were in the reset/reset state.

By performing such a reading sequence, it becomes possible to distinguish the four states and to maintain and read the four-level data.

Having completed this reading, the state of the element becomes either the set/set state or the reset/reset state. This reading is performed destructively, and therefore rewriting needs to be performed based on the read data. Specifically, the above mentioned method of writing four-level data is executed to perform rewriting, and a series of reading operations is completed.

Description of the Method of Generating a Pulse for Writing into the Phase Change Memory Cell FIG. 5A to FIG. 5C show examples of a method of generating writing pulses for realizing reading and writing of the phase change film.

As described above, the writing of a pulse needs to be performed twice in order to bring the phase change film 10 on the upper electrode 7a side into the set state and the phase change film 10 on the lower electrode 7b side into the reset state. With respect to the other states, writing can be performed by applying the writing pulse once.

Hereinafter, a method of performing writing with combinations of two writing pulses in order to simplify the writing sequence is described, with reference to FIG. 5A to FIG. 5C.

The writing pulse is generated twice. The first pulse applies a high electric current that brings the phase change film 10 on each of the electrode 7a side and the electrode 7b side into the reset state. The phase change films 10 in the close vicinity of the electrodes are brought into the reset/reset state.

On the other hand, in the case where combinations other than the reset/reset state are created finally, the second pulse is applied to create each of the states.

For example, in order to create the set/reset state (S1), an electric current of Ireset is applied with the first pulse and an electric current of ($\frac{1}{3}$)×Ireset is applied with the second pulse, to bring only the phase change film 10 on the upper electrode 7a side into the set state.

In order to create the set/set state (S2), an electric current of Ireset is applied with the first pulse and an electric current of ($\frac{1}{2}$)×Ireset is applied with the second pulse, to bring the phase change films 10 on both of the upper electrode 7a side and the lower electrode 7b side into the set state.

In order to create the reset/set state (S3), an electric current of Ireset is applied with the first pulse and an electric current of ($\frac{2}{3}$)×Ireset is applied with the second pulse, to bring the phase change film 10 on the upper electrode 7a side into the reset state and to bring the phase change film 10 on the lower electrode 7b side into the set state.

In order to create the reset/reset state (S4), that is to say, in order to bring the respective phase change films 10 on both of the electrode 7a and 7b sides into the reset state, the second pulse is not to be applied.

Figure 6:
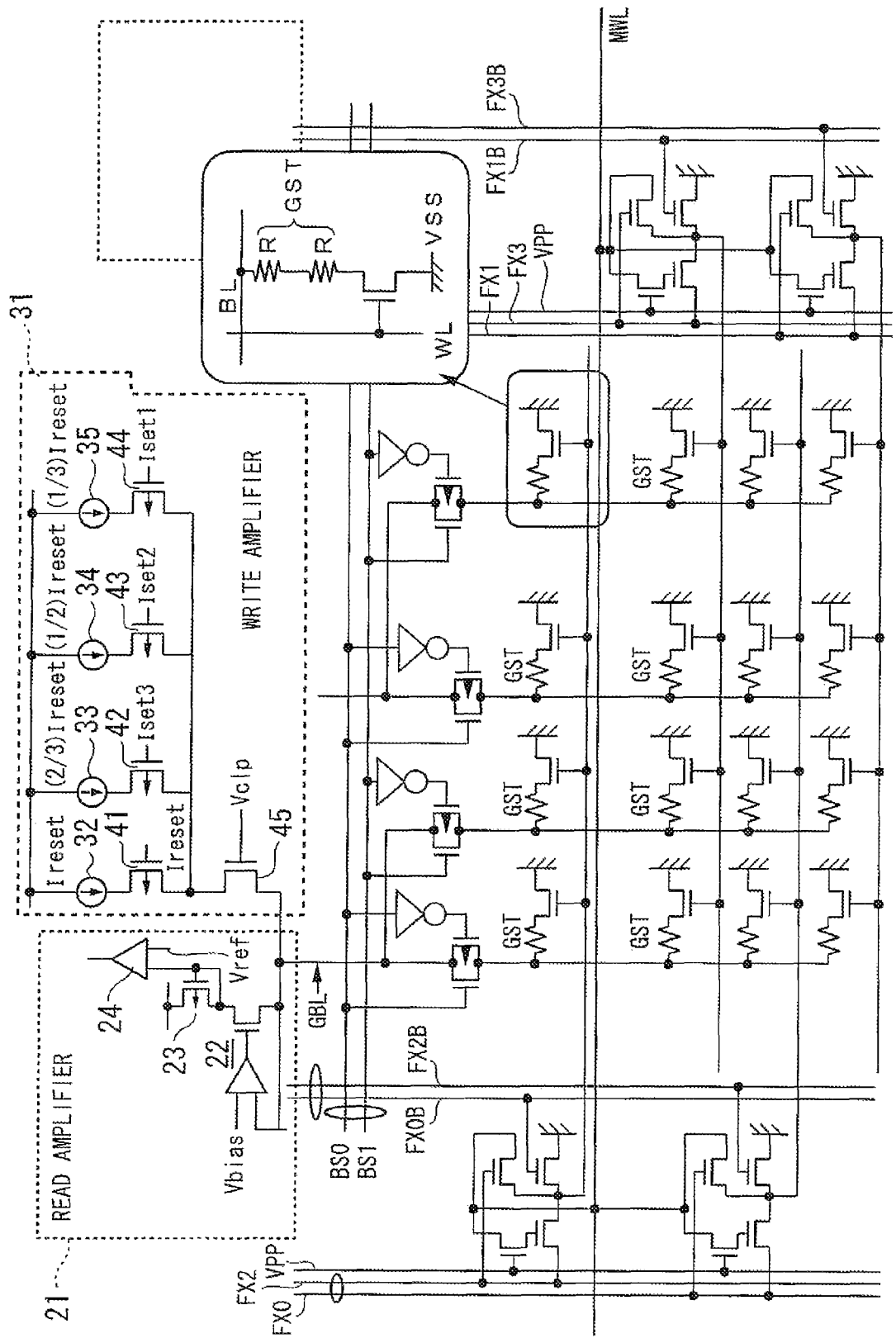
FIG. 6 is a diagram showing an example of the circuit configuration of a phase change memory device in accordance with an embodiment of the present invention.

Description of a Circuit Configuration Example that Uses the Phase Change Memory in Accordance with the Present Embodiment FIG. 6 shows an example of a circuit configuration for realizing multi-level storage with the method of the present embodiment.

A read amplifier 21 includes a circuit 22 that clamps a bit line GBL to a bias voltage (Vbias), a diode-connected element 23 of a PMOS for converting the electric current applied to a phase change film (resistor) into a voltage, and a differential amplifier 24 that compares a reading reference potential (Vref) with a potential of read data.

A writing amplifier 31 includes four write buffers (current sources) 32 to 35 capable of controlling electric current for realizing four states of the phase change film, PMOSs 41 to 44 respectively connected in series with the write buffers 32 to 35, and a clamp circuit 45 that stops the bit line voltage from exceeding 2×Vth.

A phase change film (GST) of the memory cell section is illustrated with a single resistor for the sake of simplicity. However, in reality it is formed by connecting two resistors in series.

Moreover, a hierarchical bit line configuration is employed in which two bit lines are connected to a pair of the read amplifier 21 and the write amplifier 31. A hierarchical word line configuration is also employed in which selection is made with a combination of a MWL line and a FX line. The number of bit lines to be connected to this pair of the read amplifier 21 and the write amplifier 31 is not limited to two, and the number of the bit lines may be four, eight, or more.

The write amplifier 31 selects the PMOSs 41 to 44 to be driven in accordance with writing data, and drives the gates of the selected PMOSs 41 to 44 by pulse signals to control the electric current to be applied to the phase change film (GST) of the memory cell.

The read amplifier 21 is used to read data. The bias voltage (Vbias) is a limiting potential for having the bit line GBL fixed at a constant voltage. VREF is a reference voltage (reference potential) used when performing data reading. This voltage is compared with the voltage converted from the electric current applied to the memory cell, in order to judge whether the resistance of the memory cell is in the set state (low resistance state) or in the reset state (high resistance state).

The method for reading four states (four-level data) is performed in accordance with the sequence shown in FIG. 7A to FIG. 7F.

Figure 7E:
FIG. 7A to FIG. 7F are diagrams showing a method of reading four states.
Figure 7F:
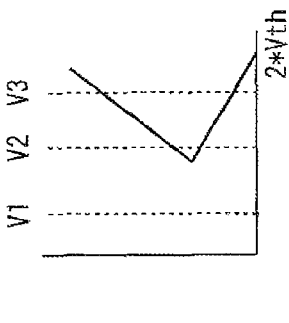
Figures 7A, 7B, 7C, 7D:
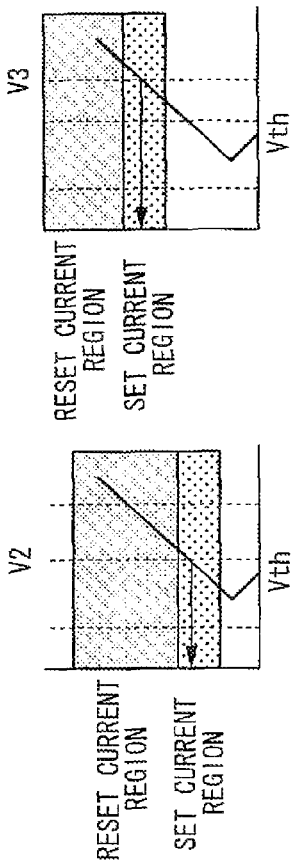
Figure 8B:
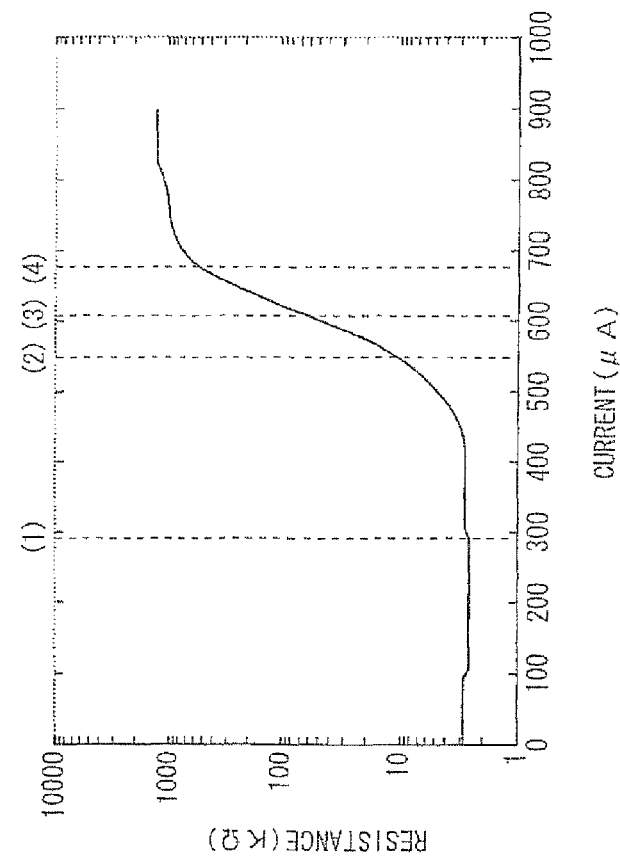
FIG. 8A and FIG. 8B are diagrams showing a resistance distribution and reference potentials of a conventional multi-level cell, FIG. 8A being a distribution of resistance of a variable-resistance type multi-level memory cell, and FIG. 8B being a relationship between writing electric current and resistance value of the phase change memory.
Figure 8A:
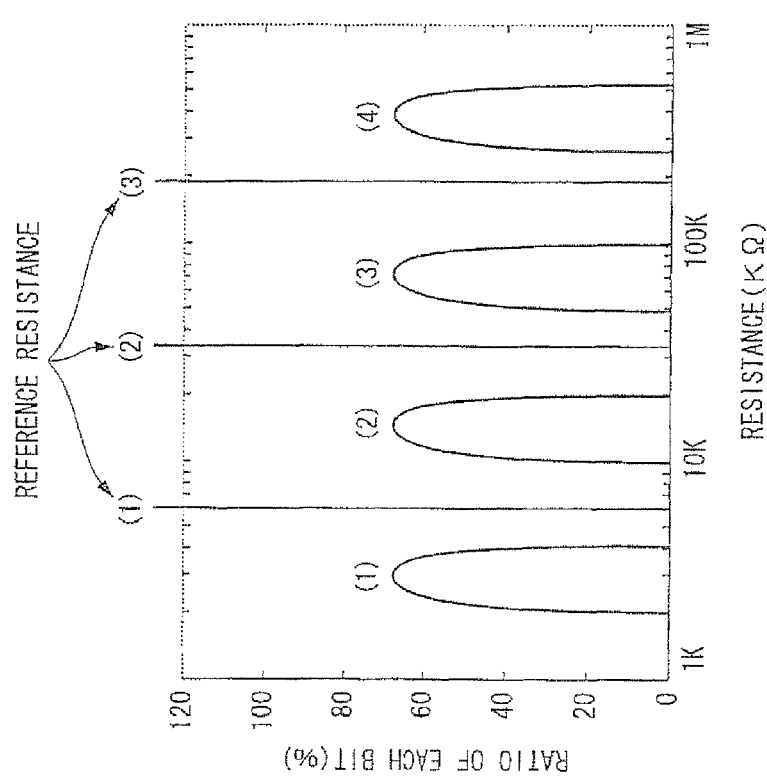

First, as a first step (S1), a reading voltage (V1) is applied in order to judge whether the resistance of the entire phase change films (GST) connected in series is a low resistance or a high resistance (refer to FIG. 7A). Only if the phase change films of the two electrode portions are in the set/set state, is it judged as a low resistance. In all other cases, the resistance of the memory cell is recognized as a high resistance.

Next, as a second step (S2), an electric current of (⅓)× Ireset which corresponds to a voltage (V2) is applied to the memory cell to bring only the upper electrode 7a side into the set state (refer to FIG. 7B).

As a step (S3), having performed writing in the step (S2), it is judged whether the resistance of the entire phase change films (GST) is a low resistance or a high resistance. If it is judged as a low resistance after performing this writing, then it is judged that the memory cell was in the reset/set state.

If the resistance is still high after performing this writing, then the memory cell is in either the set/reset state or the reset/reset state. When performing writing with this voltage (V2), the level of a clamp voltage (Vclp) in the write amplifier 31 shown in FIG. 6 is raised to a level slightly higher than 2×Vth (threshold) so that the voltage of the bit line does not exceed 2×Vth. Thereby, even in the case where the initial state of the memory cell is the reset/reset state, the phase change film on the upper electrode 7a side is prevented from being brought into the set state by the writing with the voltage (V2). Since the memory cell is not switched when both of the electrodes are in the reset state unless a voltage 2×Vth or greater is applied in between the upper and lower electrodes, no electric current is applied and the upper electrode 7a side is not brought into the set state.

Subsequently, as a step (S4), an electric current of (½)× Ireset which corresponds to a voltage (V3) is applied to bring the lower electrode 7b side into the set state (refer to FIG. 7C). Also at this time, the level of the voltage Vclp is raised to a level slightly higher than 2×Vth so that the voltage of the bit line does not exceed 2×Vth during writing. Thereby, only the phase change film on the lower electrode 7b side of the memory cell that is in the set/reset state is brought into the set state. As described above, since an electric current is hardly applied to the memory cell that is in the reset/reset state unless a voltage greater than 2×Vth is applied thereto, the lower electrode 7b side is not brought into the set state.

Having applied a writing pulse, then as a step (S5), reading is performed to judge whether the memory cell is a low resistance or a high resistance. If the memory cell is a low resistance, then the memory cell was in the set/reset state, and if it is a high resistance even after performing this writing, then the memory cell was in the reset/reset state. With the foregoing sequence, two-bit data (four-level data) can be read.

Having executed this reading, the state of the memory cell is either the set/set state or the reset/reset state, and rewriting is therefore necessary. Writing is executed by applying the pulses shown in FIG. 5C which correspond to the read data. When performing this writing, the bit line does not need to be fixed at or below 2×Vth. Therefore, the clamp voltage (Vclp) of 2×Vth or greater is used in writing (refer to FIG. 7D).

Another Embodiment

As a method of changing the electric current value for writing of the phase change film on the upper electrode 7a side and the phase change film on the lower electrode 7b side, electrode materials having different resistivities can be used rather than changing their contact areas. It is commonly known that the writing electric current decreases if a high resistance electrode material is used, and accordingly a high resistance material is used for the upper electrode 7a and a low resistance material is used for the lower electrode 7b to control the device characteristics of the respective electrode sides.

As described above, a first effect of the phase change memory device of the present embodiment is that in a phase change multi-level memory cell, in order to realize the multilevel state of the phase change films (GST) 10 in the close vicinity of the upper electrode 7a and the lower electrode 7b using four combinations of the set state and the reset state, the reading reference potential can be only one type (for only judging whether it is a high resistance or a low resistance), and since a resistance difference in the case of a high resistance and a low resistance can be large, the reading reference potential can be similar to that in the case of a generic one bit per memory cell.

A second effect is that since there are only two states of the resistance of the memory cell, that is, high resistance in reset state and low resistance in set state, the level of accuracy in resistance value control in writing may be low. Therefore, a verifying operation is not required and the circuit configuration and writing sequence can be simplified.

Moreover, a third effect of the present embodiment is that since a multi-level state can be realized by forming phase change regions in two locations of the upper electrode 7a and the lower electrode 7b, writing of two bits into a conventional one bit memory cell region can be performed. Accordingly, the memory cell region required for storing one bit can be made smaller.

In the above mentioned embodiment, an example of the case where the contact area between the upper electrode 7a and the phase change film 10 is smaller than that between the lower electrode 7b and the phase change film 10 has been described. However, this may be inversed. In this case, in the above mentioned operation, the upper electrode 7a and the lower electrode 7b are swapped.

The embodiments of the present invention have been described. However, the phase change memory device of the present invention is not limited to the above illustrated examples, and various modifications may be additionally made without departing from the gist or scope of the present invention.

What is claimed is:

1. A phase change memory device, comprising:
a single phase change film as a storage element;
a first phase change region in a first surface of the single phase change film; and
a second phase change region in a second surface of the single phase change film opposite the first surface and in a position that is aligned with the first phase change region so that the first and second phase change regions directly oppose each other in opposite surfaces of the single phase change film,
wherein the phase change memory stores two-bit data using combinations of a high resistance state due to amorphization and a low resistance state due to crystallization in the first phase change region with the high resistance state and the low resistance state in the second phase change region, the resistance value of the low resistance state being lower than that of the high resistance state.

2. A phase change memory device having a memory cell that uses a single phase change film as a storage element, comprising:
a first phase change region formed on a side of one face of the single phase change film; and
a second phase change region formed on a side of another face of the single phase change film in a position that corresponds to the first phase change region,
wherein the phase change memory stores two-bit data using combinations of a high resistance state due to amorphization and a low resistance state due to crystallization in the first phase change region with the high resistance state and the low resistance state in the second phase change region, the resistance value of the low resistance state being lower than that of the high resistance state, and
wherein
the first phase change region is formed in a close vicinity of a contact face between the single phase change film and a first electrode that is arranged so as to contact the one face of the single phase change film or a recess section on the one face,
the second phase change region is formed in a close vicinity of a contact face between the single phase change film and a second electrode that is arranged so as to contact the other face of the single phase change film or a recess section on the other face,
an area of the contact face between the first electrode and the single phase change film differs from an area of the contact face between the second electrode and the single phase change film, and
a common electric current is applied to the first electrode and the second electrode through a transistor that forms the memory cell.

3. The phase change memory device as recited in claim 2, wherein a first heater is formed in a portion where the first electrode and the single phase change film are in contact with each other, a second heater is formed in a portion where the second electrode and the single phase change film are in contact with each other, and the second heater is different in size from the first heater.

4. The phase change memory device as recited in claim 2, wherein the first electrode is arranged on a side of a metal wiring on which a bit line of the memory cell is formed, and the second electrode is arranged on a side of the transistor of the memory cell.

5. The phase change memory device as recited in claim 2, wherein
the first phase change region is brought from the high resistance state into the low resistance state by an electric current of a first electric current level Ireset1 applied through the first electrode, and the first phase change region is brought from the low resistance state into the high resistance state by an electric current of a third electric current level Ireset3 applied through the first electrode, and
the second phase change region is brought from the high resistance state into the low resistance state by an electric current of a second electric current level Ireset2 applied through the second electrode, and the second phase change region is brought from the low resistance state into the high resistance state by an electric current of a fourth electric current level Ireset4 applied through the second electrode, where Ireset1<Ireset2< Ireset3<Ireset4.

6. The phase change memory device as recited in claim 5, further comprising:
a first resistance value writing device that sets the first phase change region to the high resistance state and to set the second phase change region to the high resistance state by applying an electric current of the fourth electric current level Ireset4 to the first electrode and the second electrode;
a second resistance value writing device that sets the first phase change region to the low resistance state and to set the second phase change region to the high resistance state by applying an electric current of the first electric current level Ireset1 to the first electrode and the second electrode after an electric current of the fourth electric current level Ireset4 has been applied to the first electrode and the second electrode;
a third resistance value writing device that sets the first phase change region to the low resistance state and to set the second phase change region to the low resistance state by applying an electric current of the second electric current level Ireset2 to the first electrode and the second electrode after an electric current of the fourth electric current level Ireset4 has been applied to the first electrode and the second electrode; and
a fourth resistance value writing device that sets the first phase change region to the high resistance state and to set the second phase change region to the low resistance state by applying an electric current of the third electric current level Ireset3 to the first electrode and the second electrode after an electric current of the fourth electric current level Ireset4 has been applied to the first electrode and the second electrode.

7. The phase change memory device as recited in claim 6, further comprising:
a first resistance value reading device that determines whether an entire resistance value of the first phase change region and the second phase change region is in a high resistance state that is higher than a predetermined resistance value or in a low resistance state that is lower than the predetermined resistance value, by applying a voltage within a range in which the crystalline state of the first phase change region and the second phase change region is not changed;

a first electric current application device that applies an electric current of the first electric current level Ireset1 to the first phase change region and the second phase change region while limiting a voltage to be applied to the first electrode and the second electrode so as not to exceed a voltage twice a threshold voltage of each phase change region, in the case where the first resistance value reading device determines that the entire resistance value is the high resistance state;

a second resistance value reading device that determines whether the entire resistance value is in the high resistance state or in the low resistance state, after the first electric current application device has applied the electric current;

a second electric current application device that applies an electric current of the second electric current level Ireset2 to the first phase change region and the second phase change region while limiting a voltage to be applied to the first electrode and the second electrode so as not to exceed the voltage twice the threshold voltage of each phase change region, in the case where the second resistance value reading device determines that the entire resistance value is the high resistance state; and a third resistance value reading device that determines whether the entire resistance value is in the high resistance state or in the low resistance state, after the second electric current application device has applied the electric current.

8. The phase change memory device as recited in claim 7, wherein the first electric current application device and the second electric current application device are provided with a device for performing rewriting for bringing the first phase change region and the second phase change region into their original states, if an electric current has been applied to the first phase change region and the second phase change region.

9. The phase change memory device as recited in claim 5, wherein the area of the contact face between the first electrode and the single phase change film is set so as to be substantially two thirds of the area of the contact face between the second electrode and the single phase change film, and the first electric current level Ireset1, the second electric current level Ireset2, and the third electric current level Ireset3 are respectively set approximately as follows:

$Ireset1=(\frac{1}{3})\times Ireset4,$ $Ireset2=(\frac{1}{2})\times Ireset4, and$ $Ireset3=(\frac{2}{3})\times Ireset4.$ 10. A semiconductor device comprising:

first and second electrodes;

first and second phase change portions;

a first heater provided between the first electrode and the first phase change portion to change a resistance state of the first phase change portion; and a second heater provided between the second electrode and the second phase change portion to change a resistance state of the second phase change portion, and the second heater being different in size from the first heater.

11. The semiconductor device as recited in claim 10, further comprising a semiconductor substrate, the first and second phase change portions being aligned in a first direction perpendicular to the semiconductor substrate.

12. The semiconductor device as recited in claim 11, wherein the first and second phase change portions are the same in material as each other.

13. The semiconductor device as recited in claim 12, wherein the first and second phase change portions are merged with each other as a single phase change material.

* * * * *